(12) United States Patent
Shih

(10) Patent No.: US 11,469,210 B2
(45) Date of Patent: *Oct. 11, 2022

(54) SEMICONDUCTOR PACKAGE WITH MULTIPLE COPLANAR INTERPOSERS

(71) Applicant: Micron Technology, Inc., Boise, ID (US)

(72) Inventor: Shing-Yih Shih, New Taipei (TW)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/551,072

(22) Filed: Aug. 26, 2019

(65) Prior Publication Data

US 2019/0378818 A1  Dec. 12, 2019

Related U.S. Application Data

(63) Continuation of application No. 15/660,210, filed on Jul. 26, 2017, now Pat. No. 10,529,689, which is a
(Continued)

(51) Int. Cl.
*H01L 25/065* (2006.01)
*H01L 23/00* (2006.01)
(Continued)

(52) U.S. Cl.
CPC ...... *H01L 25/0655* (2013.01); *H01L 23/3135* (2013.01); *H01L 23/49805* (2013.01);
(Continued)

(58) Field of Classification Search
CPC ............ H01L 25/0655; H01L 23/3171; H01L 23/3192; H01L 23/49805; H01L 23/49827; H01L 24/24; H01L 24/82; H01L 24/25
See application file for complete search history.

(56) References Cited

U.S. PATENT DOCUMENTS 6,297,551 B1  10/2001  Dudderar et al.
7,045,901 B2  5/2006  Lin et al.
(Continued)

FOREIGN PATENT DOCUMENTS

CN  102148206 A  8/2011
CN  102308682 A  1/2012
(Continued)

OTHER PUBLICATIONS

Chinese Office Action from Chinese Application No. 201710082023.5, dated Feb. 5, 2018, 9 pages with English translation.
(Continued)

*Primary Examiner* — Hoa B Trinh
(74) *Attorney, Agent, or Firm* — TraskBritt

(57) ABSTRACT

A semiconductor package includes a first interposer, a second interposer, and a gap between the first interposer and the second interposer. The first interposer and the second interposer are coplanar. A first die is mounted on the first interposer and the second interposer. The first die includes first connection elements connecting the first die to the first interposer or the second interposer. A redistribution layer (RDL) structure is disposed on bottom surfaces of the first and second interposers for connecting the first interposer with the second interposer. The RDL structure includes at least one bridge trace traversing the gap to electrically connect the first interposer with the second interposer.

11 Claims, 12 Drawing Sheets

Related U.S. Application Data continuation of application No. 15/098,341, filed on Apr. 14, 2016, now Pat. No. 9,721,923.

(51) Int. Cl.
*H01L 23/538* (2006.01)
*H01L 23/31* (2006.01)
*H01L 23/498* (2006.01)
*H01L 21/56* (2006.01)

(52) U.S. Cl.
CPC .. *H01L 23/49827* (2013.01); *H01L 23/49833* (2013.01); *H01L 23/5384* (2013.01); *H01L 23/5385* (2013.01); *H01L 23/5389* (2013.01); *H01L 24/19* (2013.01); *H01L 24/20* (2013.01); *H01L 24/96* (2013.01); *H01L 24/97* (2013.01); *H01L 21/561* (2013.01); *H01L 21/568* (2013.01); *H01L 24/16* (2013.01); *H01L 24/73* (2013.01); *H01L 24/92* (2013.01); *H01L 2224/04105* (2013.01); *H01L 2224/12105* (2013.01); *H01L 2224/16146* (2013.01); *H01L 2224/16235* (2013.01); *H01L 2224/24137* (2013.01); *H01L 2224/73259* (2013.01); *H01L 2224/92224* (2013.01); *H01L 2224/96* (2013.01); *H01L 2224/97* (2013.01); *H01L 2924/157* (2013.01); *H01L 2924/1579* (2013.01); *H01L 2924/15311* (2013.01); *H01L 2924/15788* (2013.01); *H01L 2924/18161* (2013.01); *H01L 2924/3511* (2013.01)

(56) References Cited

U.S. PATENT DOCUMENTS

| | | | |
|---|---|---|---|
| 8,237,278 B2 | 8/2012 | Gluschenkov et al. | |
| 8,748,245 B1 * | 6/2014 | Stuber | H01L 27/1203 438/197 |
| 9,379,090 B1 | 6/2016 | Syed et al. | |
| 9,576,933 B1 * | 2/2017 | Lo | H01L 23/485 |
| 9,721,923 B1 * | 8/2017 | Shih | H01L 24/20 |
| 2006/0001179 A1 * | 1/2006 | Fukase | H01L 23/14 257/E23.008 |
| 2007/0108592 A1 | 5/2007 | Lai et al. | |
| 2008/0237855 A1 | 10/2008 | Fan et al. | |
| 2009/0079065 A1 | 3/2009 | Furgut et al. | |
| 2011/0176280 A1 | 7/2011 | Lee | |
| 2012/0061856 A1 | 3/2012 | Vora | |
| 2013/0082383 A1 * | 4/2013 | Aoya | H01L 21/568 257/738 |
| 2013/0200511 A1 | 8/2013 | Banijamali | |
| 2013/0292844 A1 | 11/2013 | Oh | |
| 2014/0048928 A1 | 2/2014 | Li et al. | |
| 2015/0194414 A1 | 7/2015 | Pincu et al. | |
| 2019/0393149 A1 * | 12/2019 | Wang | H01L 23/3121 |

FOREIGN PATENT DOCUMENTS

| | | |
|---|---|---|
| CN | 102386113 A | 3/2012 |
| CN | 102460690 A | 5/2012 |
| CN | 104051399 A | 9/2014 |

OTHER PUBLICATIONS

Chinese Office Action, dated Jul. 18, 2017, and Search Report, dated Jul. 3, 2017, for Chinese Application No. 105134706, 11 pages with English translation.
Taiwanese Office Action and Search Repod from Taiwanese Application No. 107105212, dated Sep. 12, 2018, 9 pages.
Taiwanese Office Action for Taiwanese Application No. 105134706, dated Jul. 18, 2017, 11 pages with English translation.
Chinese First Office Action for Application No. 201810730421.8, dated Jun. 30, 2021, 11 pages.

* cited by examiner

SEMICONDUCTOR PACKAGE WITH MULTIPLE COPLANAR INTERPOSERS

CROSS-REFERENCE TO RELATED APPLICATION

This application is a continuation of U.S. patent application Ser. No. 15/660,210, filed Jul. 26, 2017, now U.S. Pat. No. 10,529,689, issued Jan. 7, 2020, which is a continuation of U.S. patent application Ser. No. 15/098,341, filed Apr. 14, 2016, now U.S. Pat. No. 9,721,923, issued Aug. 1, 2017, the disclosure of each of which is hereby incorporated herein in its entirety by this reference reference.

TECHNICAL FIELD

1. Field of the Invention

The present invention relates to semiconductor packaging. More particularly, the present invention relates to a semiconductor package with multiple coplanar interposers.

BACKGROUND

2. Description of the Prior Art

Integrated circuit (IC) chips are typically assembled into packages that are soldered to a printed circuit board (PCB). Each integrated circuit chip may be connected to a substrate of the package with a number of solder bumps in a process commonly referred to as controlled collapsed chip connection (C4).

As known in the art, an interposer substrate such as a silicon interposer with through silicon vias (TSVs) is usually used in semiconductor packaging to "fan out" the contacts of the integrated circuit chips. As more chips are assembled in one package, the size and the surface area of the interposer substrate are also increased.

For example, for mounting a processor chip such as a Graphics Processing Unit (GPU) and several memory chips such as Graphics Double Data Rate (GDDR) chips or High-Bandwidth Memory (HBM) chips, a large-size interposer substrate having a surface area of up to 33 mm×28 mm is typically required.

However, the size of silicon interposers from the leading foundries is currently limited to 26 mm×32 mm. To fabricate the large-size silicon interposers, yields can decrease thereby increasing the cost of producing the semiconductor packages.

Further, large-size interposer substrates are prone to significant warpage when used as part of a semiconductor package, particularly during the reflow process. Warpage of the interposer substrate during fabrication of a semiconductor package can reduce yield and result in poor package reliability, both of which are highly undesirable.

BRIEF SUMMARY

It is one object of the invention to provide an improved semiconductor package with multiple coplanar interposers with smaller sizes in order to solve the above-mentioned prior art shortcomings or problems.

In one aspect of the invention, a semiconductor package includes a first interposer, a second interposer, and a gap between the first interposer and the second interposer. The first interposer and the second interposer are coplanar. A first die is mounted on the first interposer and the second interposer. The first die includes first connection elements connecting the first die to either the first interposer or the second interposer. A redistribution layer (RDL) structure is disposed on bottom surfaces of the first and second interposers for connecting the first interposer with the second interposer. The RDL structure includes at least one bridge trace traversing the gap to electrically connect the first interposer with the second interposer.

According to one embodiment, a second die is mounted on the first interposer and the second interposer. The first die and the second die are coplanar. The second die comprises a plurality of second connection elements connecting the second die to the first interposer or the second interposer. The first connection elements and the second connection elements may be solder bumps or metal bumps.

According to one embodiment, the semiconductor package further includes a first molding compound surrounding the first die and the second die, and a second molding compound encapsulating the first connection elements, the second connection elements, the first interposer, and the second interposer. The first molding compound and the second molding compound may have different compositions. The gap is filled up with the second molding compound.

These and other objectives of the present invention will no doubt become obvious to those of ordinary skill in the art after reading the following detailed description of the preferred embodiment that is illustrated in the various drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
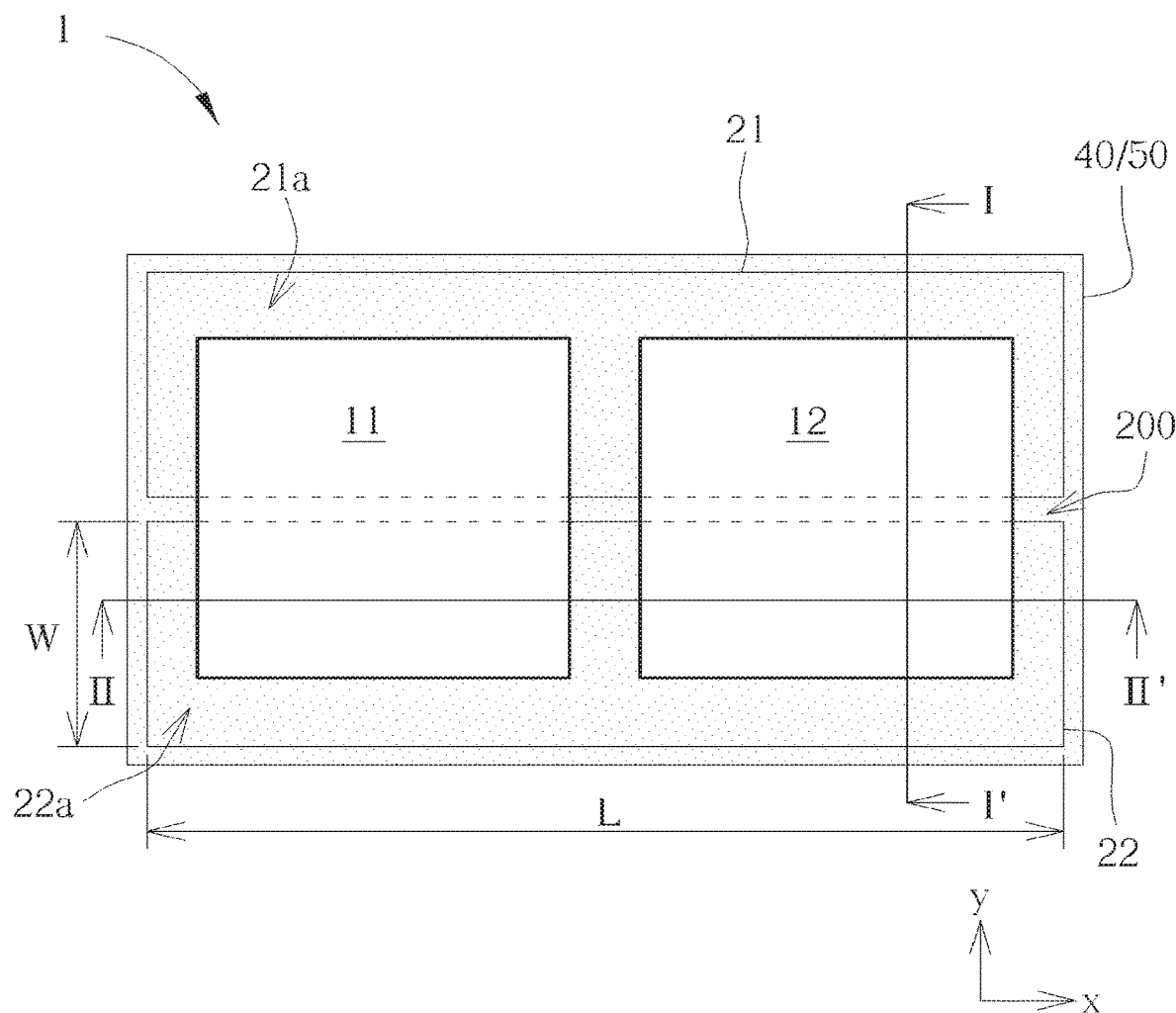
FIG. 1 is a block diagram illustrating a topographic view of a semiconductor package having two interposers in accordance with one embodiment of the invention.

It should be noted that all the figures are diagrammatic. Relative dimensions and proportions of parts of the drawings have been shown exaggerated or reduced in size, for the sake of clarity and convenience in the drawings. The same reference numerals are generally used to refer to corresponding or similar features in modified and different embodiments.

DETAILED DESCRIPTION

In the following detailed description of the invention, reference is made to the accompanying drawings, which form a part hereof, and in which is shown by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the accompanying drawings, wherein like reference numerals are used to refer to like elements throughout, and wherein the illustrated structures are not necessarily drawn to scale. The terms "die," "chip," "semiconductor chip," and "semiconductor die" may be used interchangeably throughout the specification.

The terms "wafer" and "substrate," as used herein, include any structure having an exposed surface onto which a layer is deposited according to the present invention, for example, to form the circuit structure such as a redistribution layer (RDL). The term "substrate" is understood to include semiconductor wafers, but is not limited thereto. The term "substrate" is also used to refer to semiconductor structures during processing, and may include other layers that have been fabricated thereupon.

Figure 2:
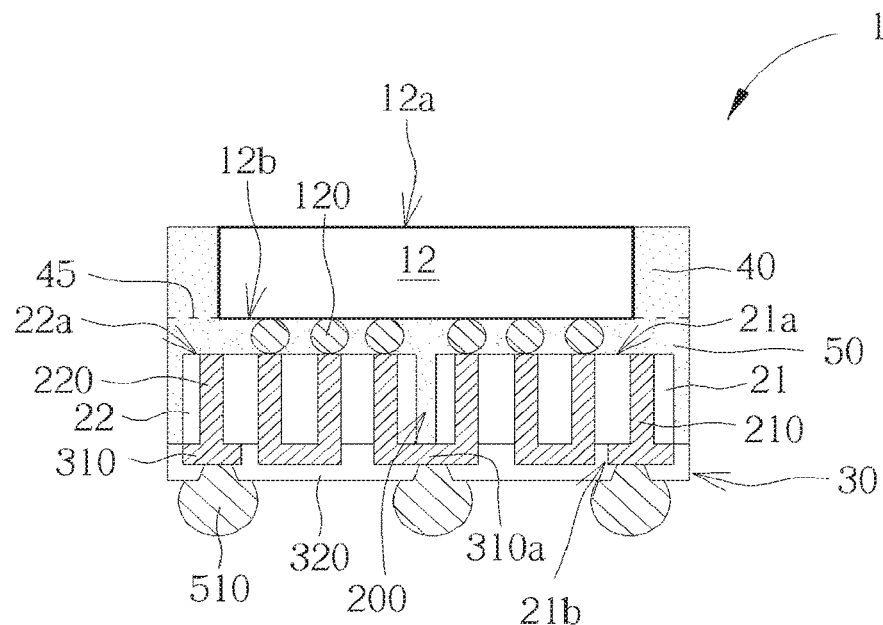
FIG. 2 is a schematic, cross-sectional diagram of the semiconductor package having two interposers taken along line I-I' of FIG. 1.
Figure 3:
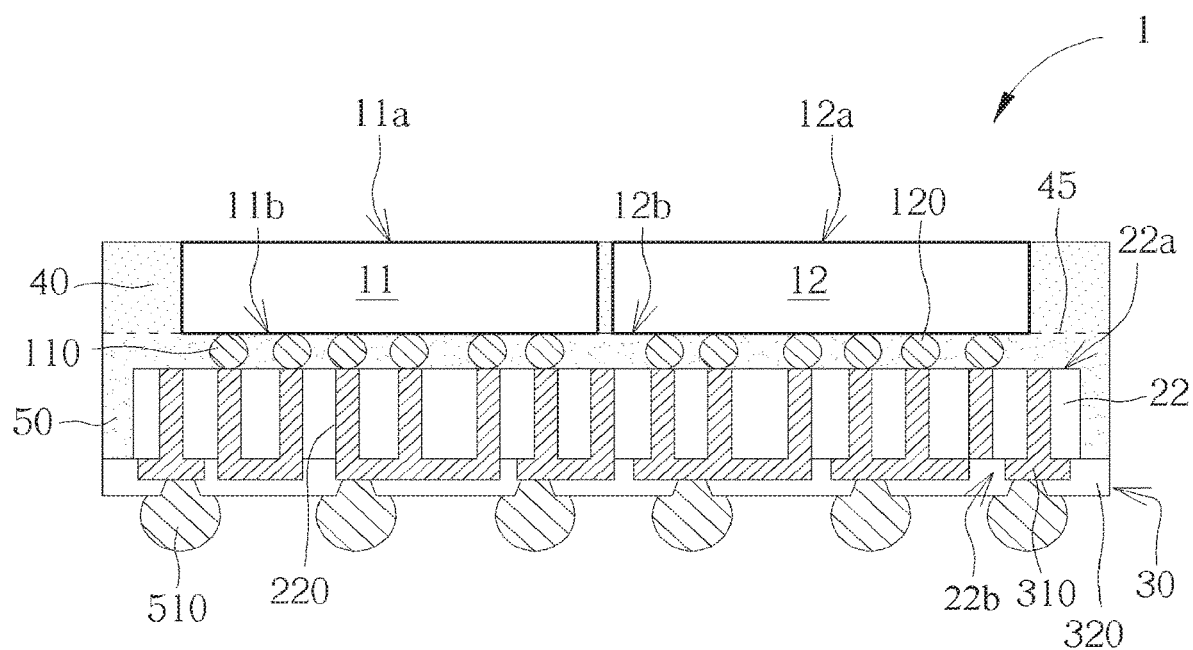
FIG. 3 is a schematic, cross-sectional diagram of the semiconductor package having two interposers taken along line II-II' of FIG. 1.

Please refer to FIG. 1 to FIG. 3. FIG. 1 is a block diagram illustrating a topographic view of a semiconductor package having two interposers in accordance with one embodiment of the invention. FIG. 2 is a schematic, cross-sectional diagram of the semiconductor package having two interposers taken along line I-I' of FIG. 1. FIG. 3 is a schematic, cross-sectional diagram of the semiconductor package having two interposers taken along line II-II' of FIG. 1.

As shown in FIG. 1 to FIG. 3, a semiconductor package 1 comprises two discrete interposers: a first interposer 21 and a second interposer 22. The first interposer 21 and the second interposer 22 may be arranged in a side-by-side manner. According to the embodiment, the first interposer 21 and the second interposer 22 are arranged in parallel along the reference y-axis. The first interposer 21 has a top surface 21a (or chip-mounting surface) and a bottom surface 21b that is opposite to the top surface 21a. The second interposer 22 has a top surface 22a (or chip-mounting surface) and a bottom surface 22b that is opposite to the top surface 22a. According to the embodiment, the first interposer 21 and the second interposer 22 are coplanar. That is, the top surface 21a is substantially flush with the top surface 22a.

The first interposer 21 and the second interposer 22 may have the same size. It is understood that the first interposer 21 and the second interposer 22 may have different sizes in some embodiments. According to the embodiment, the first interposer 21 and the second interposer 22 both have a rectangular shape when viewed from above, and may have a length L and a width W. According to the embodiment, for example, the length L may be equal to or smaller than 32 mm, and the width W may equal to or smaller than 26 mm, but is not limited thereto. A continuous, slender gap 200 is located between the first interposer 21 and the second interposer 22. The body of the first interposer 21 is separated from the body of the second interposer 22 by the gap 200.

According to various embodiments, the first interposer 21 and the second interposer 22 may be made of silicon, glass, or organic material. Other types of interposers can be used without departing from the scope of the disclosure. The first interposer 21 and the second interposer 22 may be manufactured in wafer or array form and may contain integrated active or passive devices (not shown). The first interposer 21 and the second interposer 22 may further contain through silicon vias (TSVs) 210 and 220.

The semiconductor package 1 further comprises a first chip or die 11 and a second chip or die 12 mounted onto the top surface 21a of the first interposer 21 and the top surface 22a of the second interposer 22 in a flip-chip manner. According to various embodiments, the first die 11 and the second die 12 are coplanar. According to the embodiment, the first die 11 and the second die 12 are arranged in parallel along the reference x-axis. Although only two dies 11 and 12 are illustrated in the figures, it is understood that more dies, for example, three or four dies, may be mounted on the two interposers in various embodiments. The first die 11 has a top surface 11a and a bottom surface (or active surface) 11b that is opposite to the top surface 11a. The second die 12 has a top surface 12a and a bottom surface (or active surface) 12b that is opposite to the top surface 12a. On the active surfaces 11b and 12b of the first die 11 and the second die 12, a plurality of input/output (I/O) pads (not shown) may be provided.

As can be best seen in FIG. 2 and FIG. 3, the first die 11 is electrically connected to the first interposer 21 and the second interposer 22 through a plurality of connection elements 110 such as solder bumps or metal bumps formed on the bottom surface 11b. The second die 12 is electrically connected to the first interposer 21 and the second interposer 22 through a plurality of connection elements 120 such as solder bumps or metal bumps formed on the bottom surface 12b.

According to the embodiment, the first die 11 and the second die 12 are surrounded by a first molding compound 40. According to the embodiment, the connection elements 110, the connection elements 120, the first interposer 21, and the second interposer 22 are encapsulated by a second molding compound 50. According to the embodiment, the top surface 11a of the first die 11 and the top surface 12a of the second die 12 may be exposed from the first molding compound 40. According to the embodiment, the bottom surface 11b of the first die 11 and the bottom surface 12b of the second die 12 may be covered by the second molding compound 50. An interface 45, as shown by dashed line, between the first molding compound 40 and the second molding compound 50 may be flush with the bottom surface (active surface) 11b of the first die 11 and the bottom surface 12b of the second die 12. The gap 200 is filled up with the second molding compound 50.

According to the embodiment, the first molding compound 40 and the second molding compound 50 may be subjected to curing processes. The first molding compound 40 and the second molding compound 50 may comprise a mixture of epoxy and silica fillers, but not limited thereto. According to the embodiment, the first molding compound 40 and the second molding compound 50 may comprise different compositions and may be cured at different temperatures, but is not limited thereto.

According to the embodiment, on the bottom surface 21b of the first interposer 21 and on the bottom surface 22b of the second interposer 22, a redistribution layer (RDL) structure 30 is formed. The RDL structure 30 may comprise at least one metal layer 310 and at least one dielectric layer 320. The dielectric layer 320 may comprise organic materials such as polyimide (PI) or inorganic materials such as silicon nitride, silicon oxide or the like, but not limited thereto. The metal layer 310 may comprise aluminum, copper, tungsten, titanium, titanium nitride, or the like. It is understood that in some embodiments the RDL structure 30 may comprise multiple metal layers or traces.

According to the embodiment, circuits including TSVs 210 in the first interposers 21 and circuits including TSVs 220 in the second interposer 22 may be interconnected through at least one metal trace (or bridge trace) 310a, which traverses the gap 200. The metal trace 310a and the metal layer 310 of the RDL structure 30 may propagate signals among the first die 11 and the second die 12. Connectors 510 such as solder balls, ball grid arrays (BGAs), C4 bumps, metal bumps, or metal pillars may be formed on the lower surface of the RDL structure 30 to electrically connect to the metal layer 310 and the metal trace 310a.

According to the embodiment, the semiconductor package 1 may be a 2.5-dimensional (2.5D) multi-die package with two dies and two discrete interposers 21, 22 arranged in a side-by-side manner. Each of the two discrete interposers 21, 22 has a surface area that is smaller than is conventionally required for such semiconductor package, according to the prior art. Therefore, the yields of fabricating such interposers can be improved. Further, by using multiple coplanar interposers having smaller sizes, the warpage of the semiconductor package is improved.

The two discrete interposers 21, 22 are not in direct physical contact. Through the RDL structure 30 formed on the bottom surfaces of the two discrete interposers, the two discrete interposers 21, 22 are electrically interconnected to each other. It is another structural feature is that the semiconductor package 1 comprises two molding compounds 40 and 50. The two molding compounds 40 and 50 may be composed of different compositions. The gap 200 between the first interposer 21 and the second interposer 22 is filled up with the second molding compound 50.

FIG. 4 to FIG. 10 are schematic, cross-sectional diagrams showing an exemplary method for fabricating the semiconductor package having the two interposers of FIG. 1, wherein like numeral numbers designate like regions, layers, or elements. The semiconductor package having the two interposers 21, 22 of FIG. 1 can be fabricated by using a wafer-level packaging method.

Figure 4:
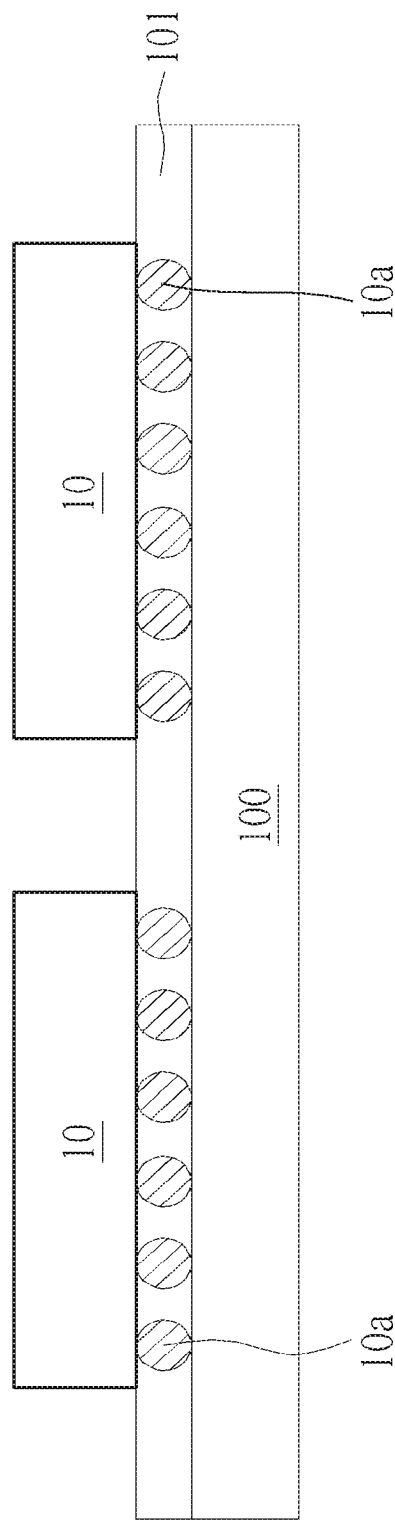
FIG. 4 to FIG. 10 are schematic, cross-sectional diagrams showing an exemplary method for fabricating the semiconductor package having two interposers of FIG. 1.

First, as shown in FIG. 4, a carrier 100 is provided. The carrier 100 may be composed of a releasable substrate material with an adhesive layer 101, but is not limited thereto. A plurality of semiconductor dies 10 are mounted on the carrier 100 in a flip-chip manner. Each die 10 comprises a plurality of connection elements 10a on its active surface. The connection elements 10a are attached to the carrier 100 by the adhesive layer 101.

Figure 5:
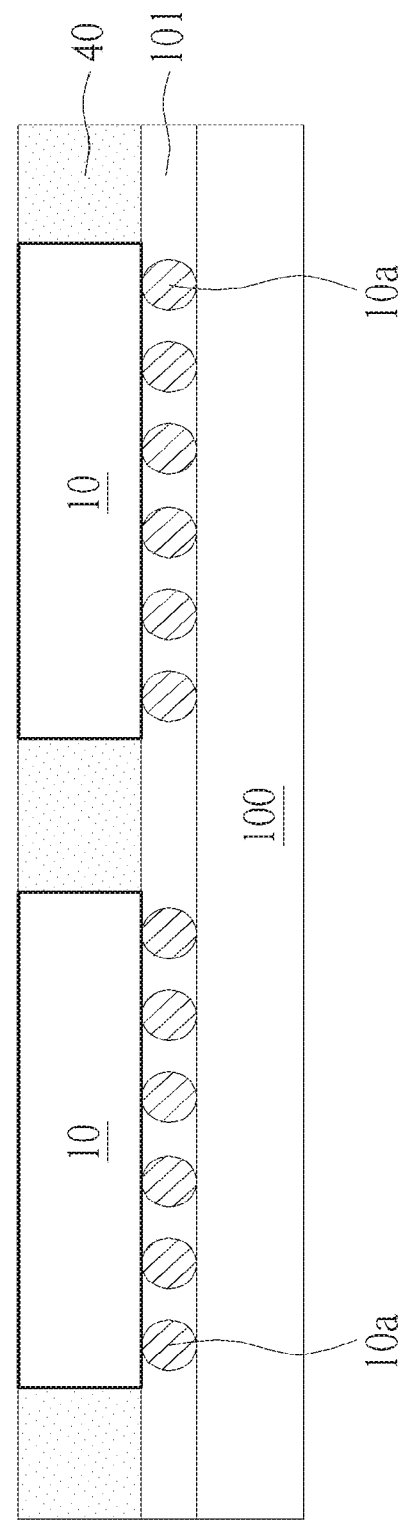

As shown in FIG. 5, a first molding compound 40 is applied. The first molding compound 40 covers the attached dies 10 and the top surface of the adhesive layer 101. The first molding compound 40 may be subjected to a curing process. The first molding compound 40 may comprise a mixture of epoxy and silica fillers, but not limited thereto. The first molding compound 40 may be subjected to a grinding process or polishing process to thereby remove an upper portion of the first molding compound 40. At this point, the top surfaces of the dies 10 are exposed and may be flush with the top surface of the first molding compound 40.

Figure 6:
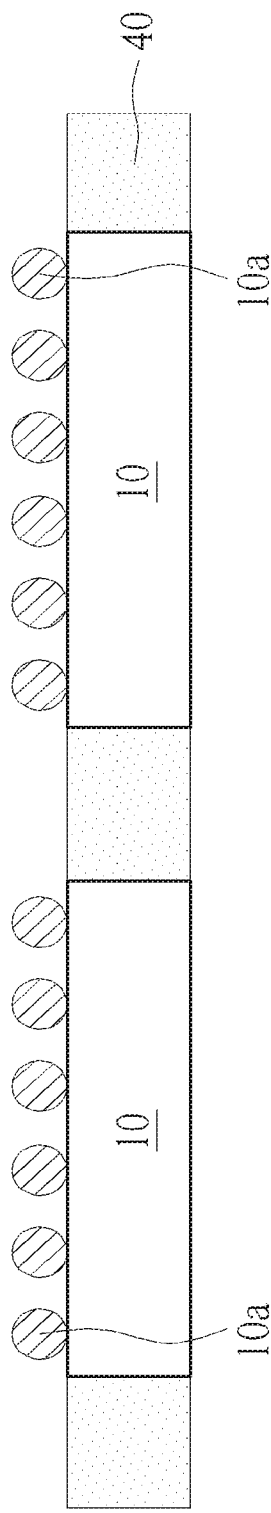

As shown in FIG. 6, the carrier 100 including the adhesive layer 101 is removed to thereby expose the active surfaces of the dies 10 and the connection elements 10a. Optionally, another carrier (not shown) may be attached to the exposed top surfaces of the dies 10 for providing temporary support before removing the carrier 100. The debonding of the carrier 100 may be performed by using a laser process or UV (ultraviolet) irradiation process, but is not limited thereto.

Figure 7:
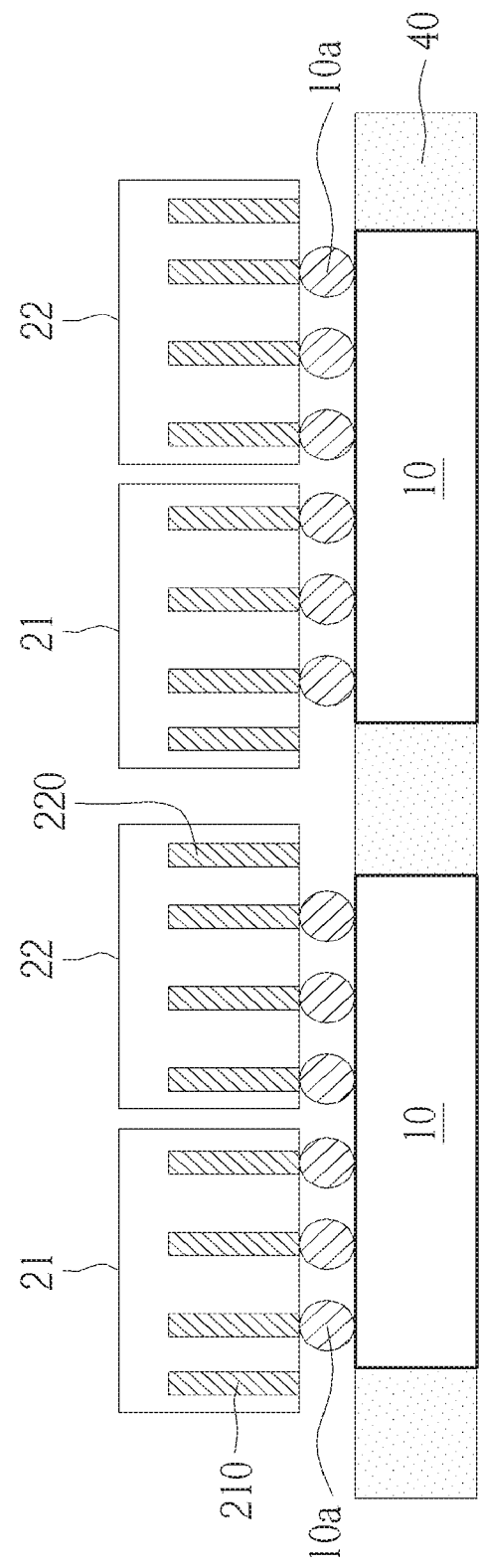

As shown in FIG. 7, a plurality of pre-fabricated first interposers 21 and a plurality of pre-fabricated second interposers 22 are mounted onto the connection elements 10a. The first interposers 21 and the second interposers 22 may be manufactured in wafer or array form, and then cut from the wafer to form the discrete interposers. Each of the interposers 21, 22 may contain integrated active or passive devices (not shown) and through silicon vias (TSVs). According to the embodiment, the circuits in each of the pre-fabricated first interposers 21 may be different from the circuits in each of the pre-fabricated first interposers 21.

According to the embodiment, for example, the TSVs 210 of the first interposer 21 and the TSVs 220 of the second interposer 22 may be aligned with the connection elements 10a. It is understood that metal layers or pad structures (not shown) may be fabricated in the interposers. According to the embodiment, each TSV 210 or 220 has one end that is electrically connected to each of the connection elements 10a, and the other end still buried in the body of the interposer at this point.

Figure 8:
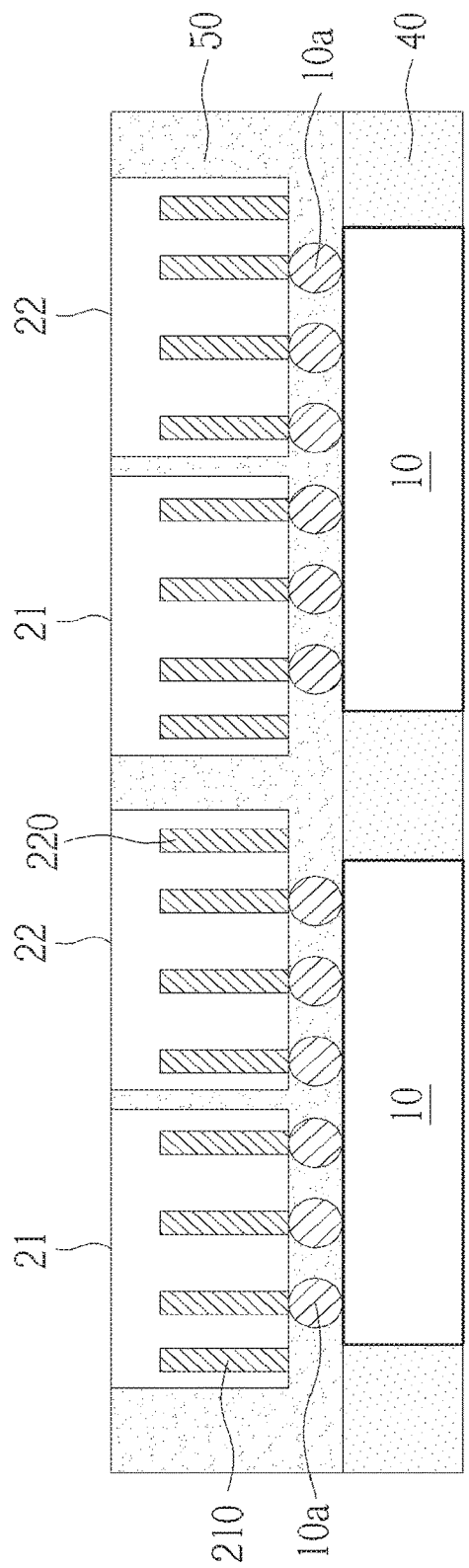

As shown in FIG. 8, a second molding compound 50 is applied. The second molding compound 50 covers the first interposer 21 and the second interposer 22. The second molding compound 50 may fill into the gap 200 (FIG. 2) between the interposers 21, 22 and the dies 10, and surrounds the connection elements 10a. The second molding compound 50 may be subjected to a curing process. The second molding compound 50 may comprise a mixture of epoxy and silica fillers, but is not limited thereto. The second molding compound 50 may be subjected to a grinding process or polishing process to thereby remove an upper portion of the second molding compound 50 and a portion of each of the first interposer 21 and the second interposer 22 to thereby expose the other ends of the TSVs 210 and 220.

Figure 9:
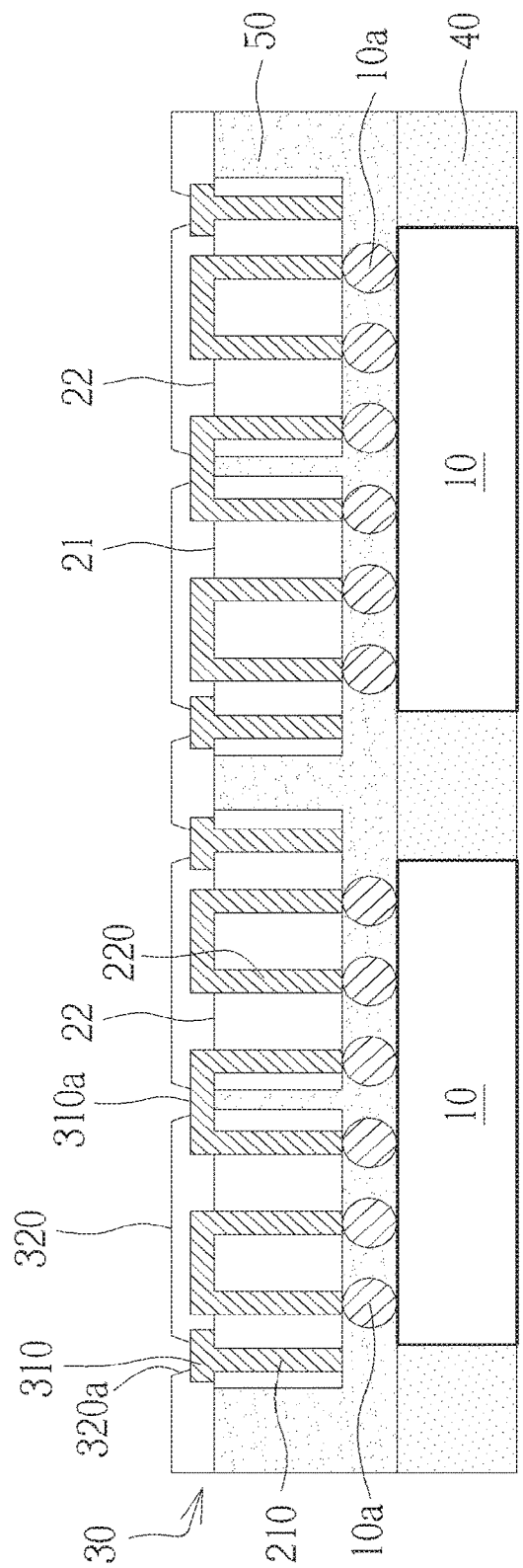

As shown in FIG. 9, a redistribution layer (RDL) structure 30 is formed. The RDL structure 30 may comprise at least one metal layer 310 and at least one dielectric layer 320. The dielectric layer 320 may comprise organic materials such as polyimide (PI) or inorganic materials such as silicon nitride, silicon oxide or the like, but not limited thereto. The metal layer 310 may comprise aluminum, copper, tungsten, titanium, titanium nitride, or the like. It is understood that in some embodiments the RDL structure 30 may comprise multiple metal layers or traces.

According to the embodiment, the circuits including TSVs 210 in each first interposer 21 and the circuits including TSVs 220 in each second interposer 22 may be interconnected through at least one metal trace (or bridge trace) 310a, which traverses the gap 200 (FIG. 2) between the first interposer 21 and the second interposer 22. A plurality of openings 320a may be formed in the RDL structure 30 to expose solder pads in the metal layer 310.

Figure 10:
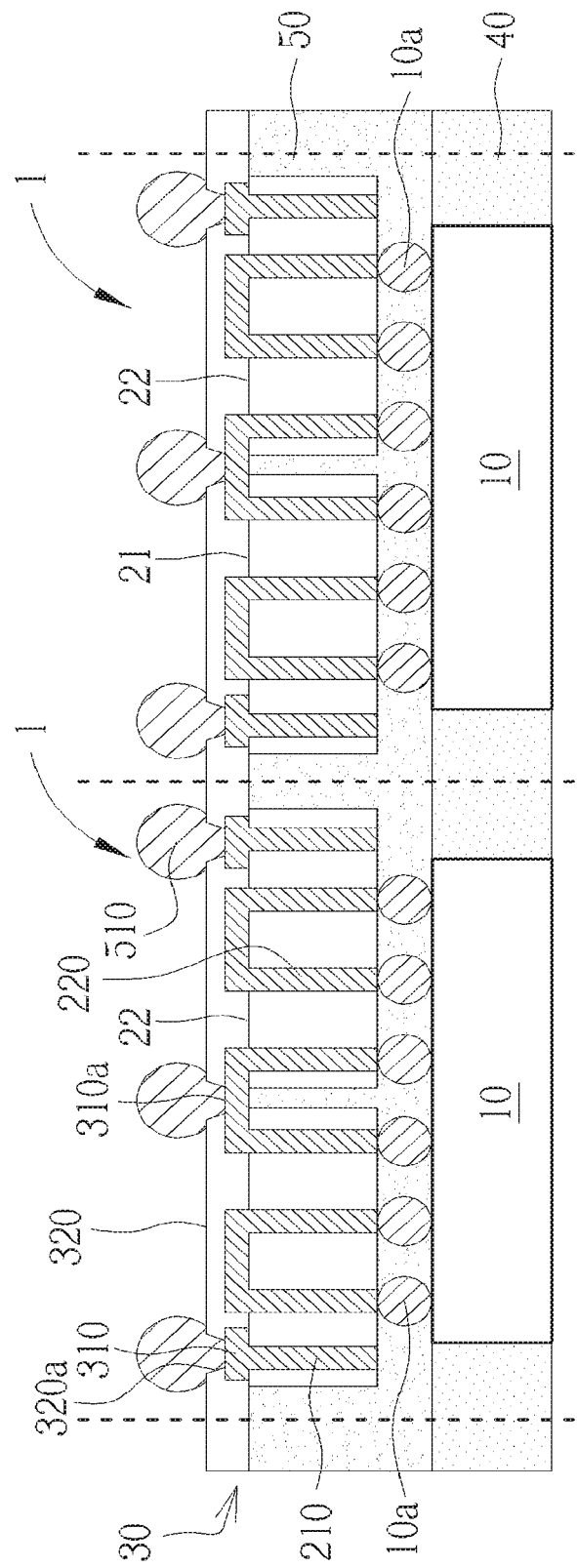

As shown in FIG. 10, connectors 510 such as solder balls, ball grid arrays (BGAs), C4 bumps, metal bumps, or metal pillars may be formed in the openings 320a to electrically connect to the metal layer 310 and the metal trace 310a. The wafer level package is then diced and singulated into individual semiconductor packages 1. For example, before wafer dicing, the wafer level package may be first attached to a dicing tape (not shown), where the connectors 510 face toward, and may contact, the dicing tape.

Figure 11:
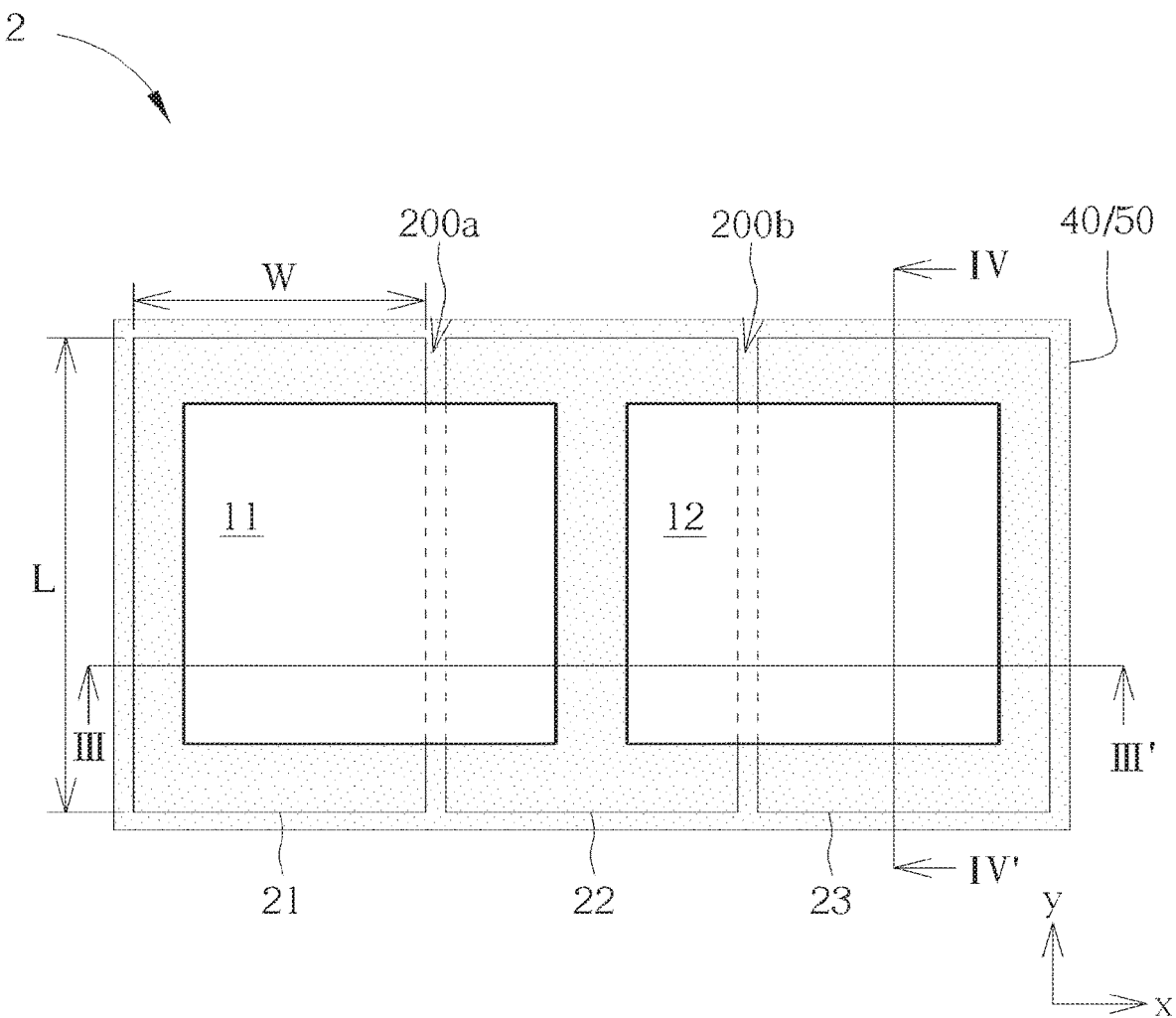
FIG. 11 is a block diagram illustrating a topographic view of a semiconductor package having three interposers in accordance with another embodiment of the invention.
Figure 12:
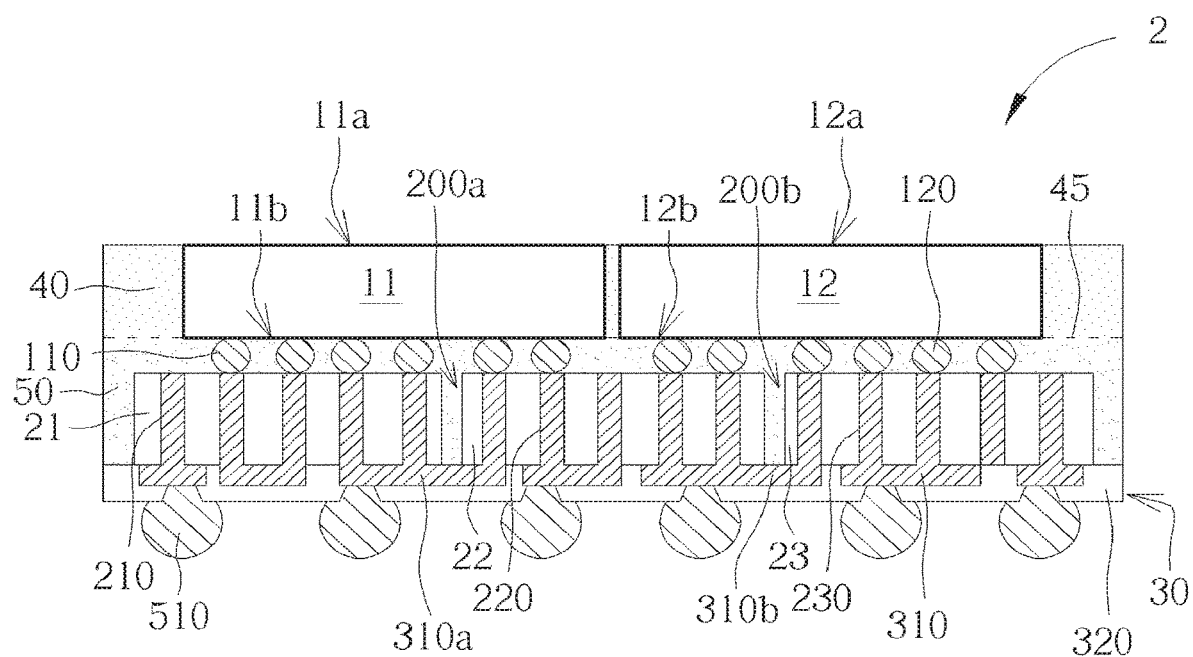
FIG. 12 is a schematic, cross-sectional diagram of the semiconductor package having three interposers taken along line III-III' of FIG. 11.
Figure 13:
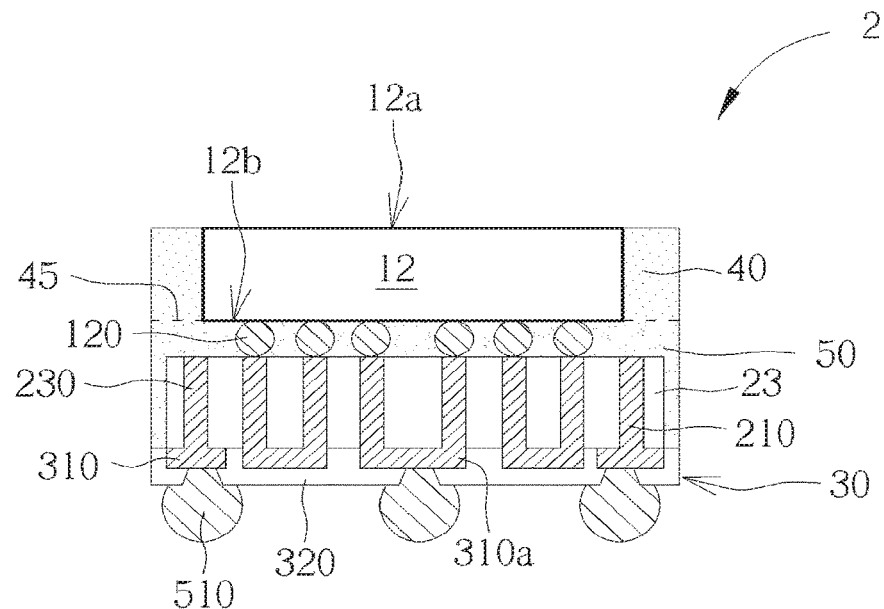
FIG. 13 is a schematic, cross-sectional diagram of the semiconductor package having three interposers taken along line IV-IV' of FIG. 11.

Please refer to FIG. 11 to FIG. 13. FIG. 11 is a block diagram illustrating a topographic view of a semiconductor package having three interposers in accordance with another embodiment of the invention. FIG. 12 is a schematic, cross-sectional diagram of the semiconductor package having three interposers taken along line of FIG. 11. FIG. 13 is a schematic, cross-sectional diagram of the semiconductor package having three interposers taken along line IV-IV' of FIG. 11.

As shown in FIG. 11 to FIG. 13, the semiconductor package 2 comprises three discrete interposers: a first interposer 21, a second interposer 22, and a third interposer 23. The first interposer 21, the second interposer 22, and the third interposer 23 may have the same size and may be arranged in a side-by-side manner. According to the embodiment, the first interposer 21, the second interposer 22, and the third interposer 23 are arranged in parallel along the reference x-axis.

According to the embodiment, the first interposer 21, the second interposer 22, and the third interposer 23 have a rectangular shape when viewed from the above, and may have a length L and a width W. According to the embodiment, for example, the length L may be equal to or smaller than 32 mm, and the width W may equal to or smaller than 26 mm, but is not limited thereto.

A continuous, slender gap 200a is located between the first interposer 21 and the second interposer 22. A continuous, slender gap 200b is located between the second interposer 22 and the third interposer 23. The gaps 200a and 200b separate the first interposer 21, the second interposer 22, and the third interposer 23 from one another.

According to various embodiments, the first interposer 21, the second interposer 22, and the third interposer 23 may be made of silicon, glass, or organic material. Other types of interposers can be used without departing from the scope of the disclosure. The first interposer 21, the second interposer 22, and the third interposer 23 may be manufactured in wafer or array form and may contain integrated active or passive devices (not shown) and through silicon vias (TSVs) 210, 220, and 230.

A first die 11 and a second die 12 are mounted onto the first interposer 21, the second interposer 22, and the third interposer 23 in a flip-chip manner. According to various embodiments, the first die 11 and the second die 12 are coplanar. According to the embodiment, the first die 11 and the second die 12 are arranged in parallel along the reference x-axis. Although only two dies 11 and 12 are illustrated in the figures, it is understood that more dies, for example, three or four dies may be mounted on the two interposers in various embodiments.

According to the embodiment, the first die 11 is mounted between the first interposer 21 and the second interposer 22 and traverses the gap 200a. According to the embodiment, the second die 12 is mounted between the second interposer 22 and the third interposer 23 and traverses the gap 200b. As can be best seen in FIG. 12 and FIG. 13, the first die 11 is electrically connected to the first interposer 21 and the second interposer 22 through a plurality of connection elements 110 such as solder bumps or metal bumps. The second die 12 is electrically connected to the second interposer 22 and the third interposer 23 through a plurality of connection elements 120 such as solder bumps or metal bumps.

According to the embodiment, the first die 11 and the second die 12 are surrounded by a first molding compound 40. According to the embodiment, the connection elements 110, the connection elements 120, the first interposer 21, the second interposer 22, and the third interposer 23 are encapsulated by a second molding compound 50. The gaps 200a and 200b are filled up with the second molding compound 50. According to the embodiment, the first molding compound 40 and the second molding compound 50 may comprise different compositions and may be cured at different temperatures, but is not limited thereto.

The semiconductor package 2 further comprises a redistribution layer (RDL) structure 30. The RDL structure 30 may comprise at least one metal layer 310 and at least one dielectric layer 320. The dielectric layer 320 may comprise organic materials such as polyimide (PI) or inorganic materials such as silicon nitride, silicon oxide or the like, but not limited thereto. The metal layer 310 may comprise aluminum, copper, tungsten, titanium, titanium nitride, or the like. It is understood that in some embodiments the RDL structure 30 may comprise multiple metal layers or traces.

According to the embodiment, the circuits including TSVs 210 in the first interposer 21 and the circuits including TSVs 220 in the second interposer 22 may be interconnected through at least one metal trace (or bridge trace) 310a, which traverses the gap 200a. According to the embodiment, the circuits including TSVs 220 in the second interposer 22 and the circuits including TSVs 230 in the third interposer 23 may be interconnected through at least one metal trace (or bridge trace) 310b, which traverses the gap 200b. The metal trace 310a, the metal trace 310b, and the metal layer 310 of the RDL structure 30 may propagate signals among the first die 11 and the second die 12. Connectors 510 such as solder balls, ball grid array (BGA) balls, C4 bumps, metal bumps, or metal pillars may be formed on the lower surface of the RDL structure 30 to electrically connect to the metal layer 310 and the metal traces 310a and 310b.

Figure 14:
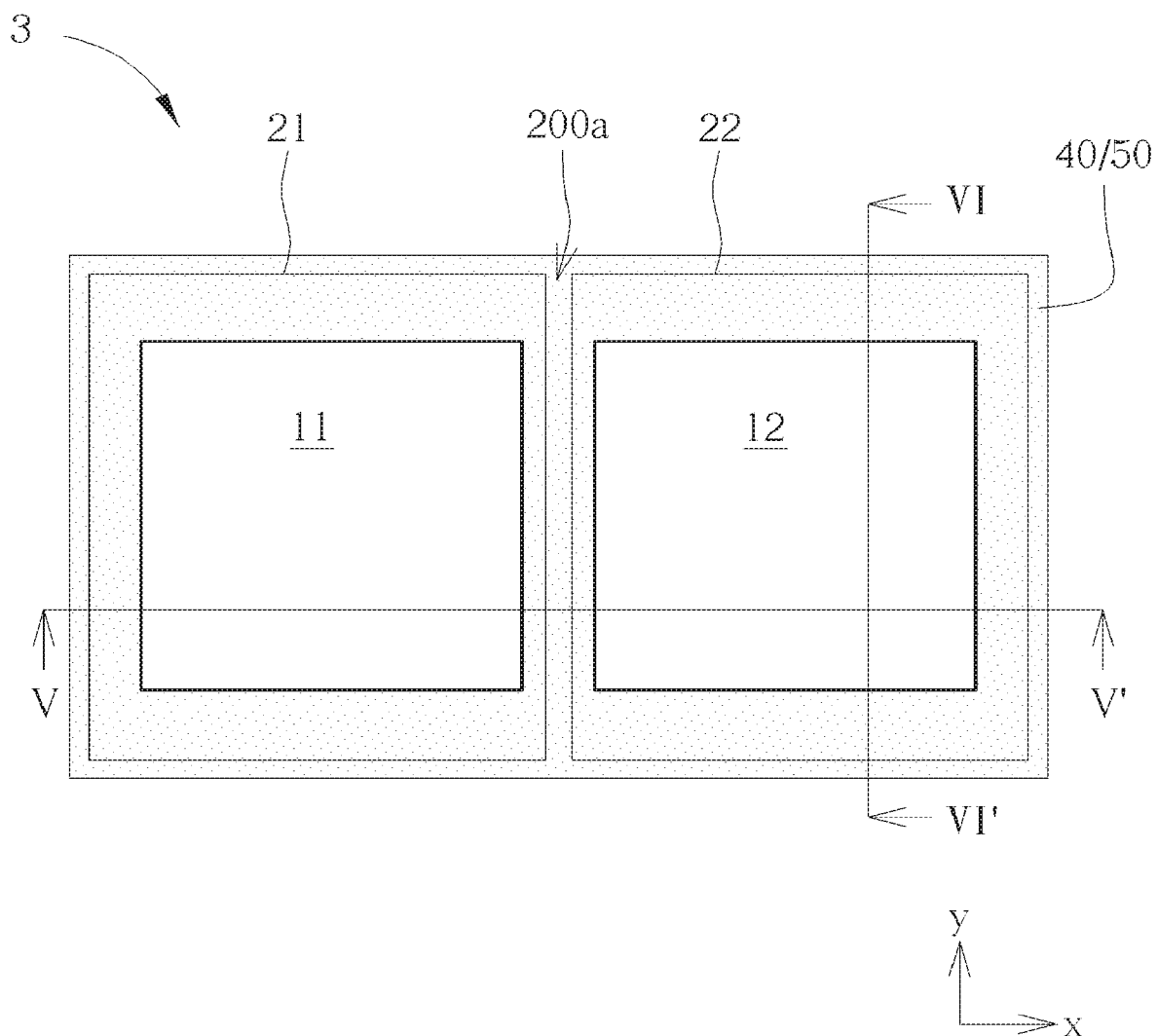
FIG. 14 is a block diagram illustrating a topographic view of a semiconductor package having two interposers in accordance with another embodiment of the invention.
Figure 15:
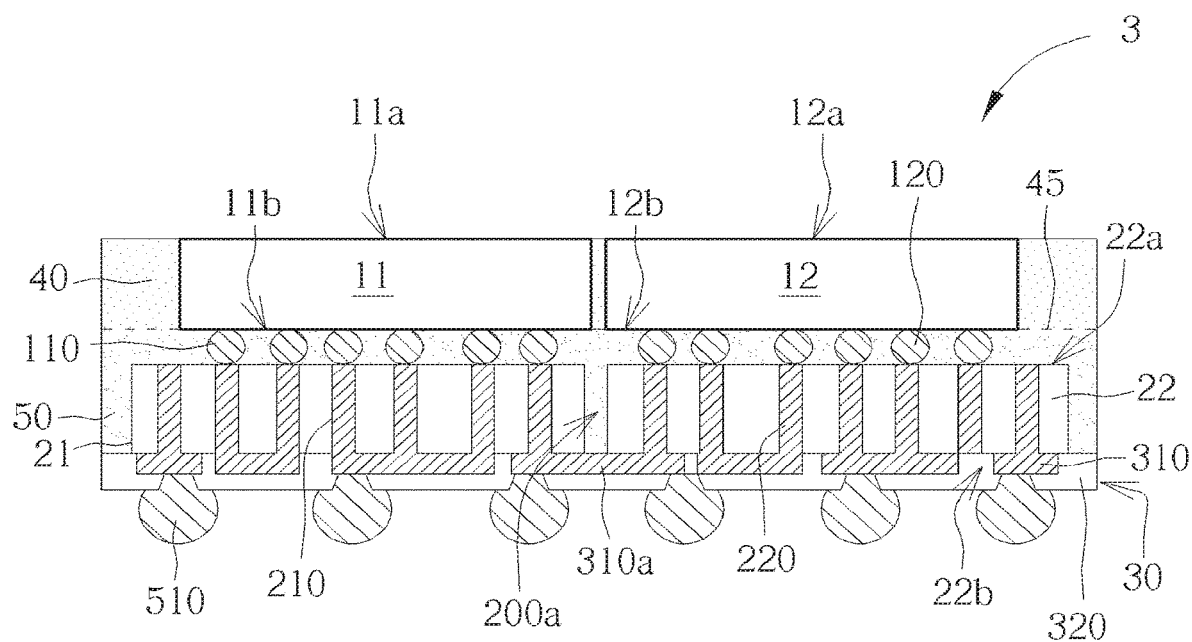
FIG. 15 is a schematic, cross-sectional diagram of the semiconductor package having two interposers taken along line V-V' of FIG. 14.
Figure 16:
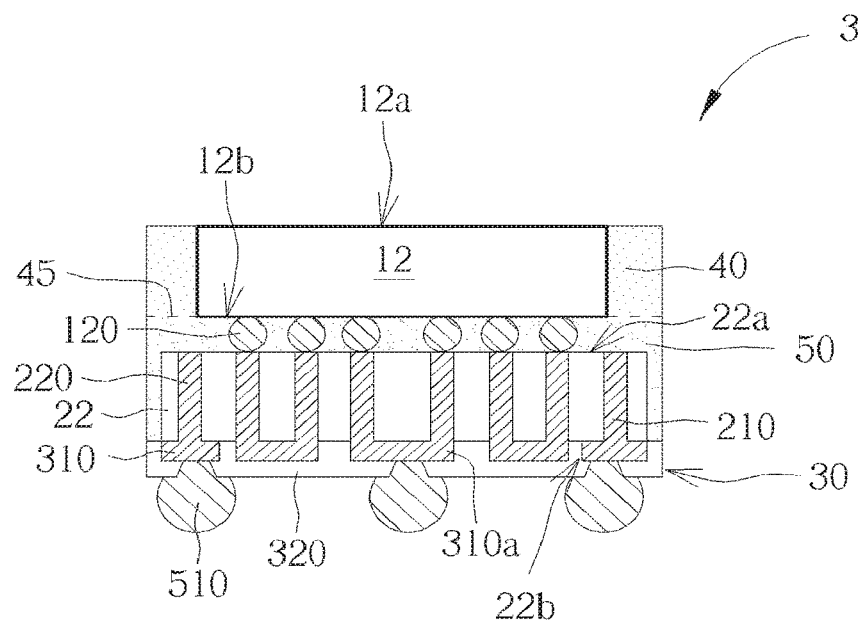
FIG. 16 is a schematic, cross-sectional diagram of the semiconductor package having two interposers taken along line VI-VI' of FIG. 14.

Please refer to FIG. 14 to FIG. 16. FIG. 14 is a block diagram illustrating a topographic view of a semiconductor package having two interposers in accordance with another embodiment of the invention. FIG. 15 is a schematic, cross-sectional diagram of the semiconductor package having two interposers taken along line V-V' of FIG. 14. FIG. 16 is a schematic, cross-sectional diagram of the semiconductor package having two interposers taken along line VI-VI' of FIG. 14.

As shown in FIG. 14 to FIG. 16, the semiconductor package 3 comprises two discrete interposers: a first interposer 21 and a second interposer 22. The first interposer 21 and the second interposer 22 may have the same size and may be arranged in a side-by-side manner. According to the embodiment, the first interposer 21 and the second interposer 22 are arranged in parallel along the reference x-axis. According to the embodiment, the first interposer 21 and the second interposer 22 may have a rectangular shape when viewed from the above. A continuous, slender gap 200a is located between the first interposer 21 and the second interposer 22. The gap 200a separates the first interposer 21 from the second interposer 22.

According to various embodiments, the first interposer 21 and the second interposer 22 may be made of silicon, glass, or organic material. Other types of interposers can be used without departing from the scope of the present subject matter. The first interposer 21 and the second interposer 22 may be manufactured in wafer or array form and may contain integrated active or passive devices (not shown) and through silicon vias (TSVs) 210, 220.

A first die 11 is mounted only onto the first interposer 21 in a flip-chip manner. A second die 12 is mounted only onto the second interposer 22 in a flip-chip manner. According to various embodiments, the first die 11 and the second die 12 are coplanar. According to the embodiment, the first die 11 and the second die 12 are arranged in parallel along the reference x-axis. Although only two dies 11 and 12 are illustrated in the figures, it is understood that more dies, for example, three or four dies may be mounted on the two interposers in various embodiments.

According to the embodiment, the first die 11 and the second die 12 do not traverse or overlap the gap 200a. As can be best seen in FIG. 15 and FIG. 16, the first die 11 is electrically connected to the first interposer 21 through a plurality of connection elements 110 such as solder bumps or metal bumps. The second die 12 is electrically connected to the second interposer 22 through a plurality of connection elements 120 such as solder bumps or metal bumps.

According to the embodiment, the first die 11 and the second die 12 are surrounded by a first molding compound 40. According to the embodiment, the connection elements 110, the connection elements 120, the first interposer 21, and the second interposer 22 are encapsulated by a second molding compound 50. The gap 200a is filled up with the second molding compound 50. According to the embodiment, the first molding compound 40 and the second molding compound 50 may comprise different compositions and may be cured at different temperatures, but is not limited thereto.

The semiconductor package 3 further comprises a redistribution layer (RDL) structure 30. The RDL structure 30 may comprise at least one metal layer 310 and at least one dielectric layer 320. The dielectric layer 320 may comprise organic materials such as polyimide (PI) or inorganic materials such as silicon nitride, silicon oxide or the like, but not limited thereto. The metal layer 310 may comprise aluminum, copper, tungsten, titanium, titanium nitride, or the like. It is understood that in some embodiments the RDL structure 30 may comprise multiple metal layers or traces.

According to the embodiment, the circuits including TSVs 210 in the first interposer 21 and the circuits including TSVs 220 in the second interposer 22 may be interconnected through at least one metal trace (or bridge trace) 310a, which traverses the gap 200a. The metal trace 310a and the metal layer 310 of the RDL structure 30 may propagate signals among the first die 11 and the second die 12. Connectors 510 such as solder balls, ball grid array (BGA) balls, C4 bumps, metal bumps, or metal pillars may be formed on the lower surface of the RDL structure 30 to electrically connect to the metal layer 310 and the metal trace 310a.

Figure 17:
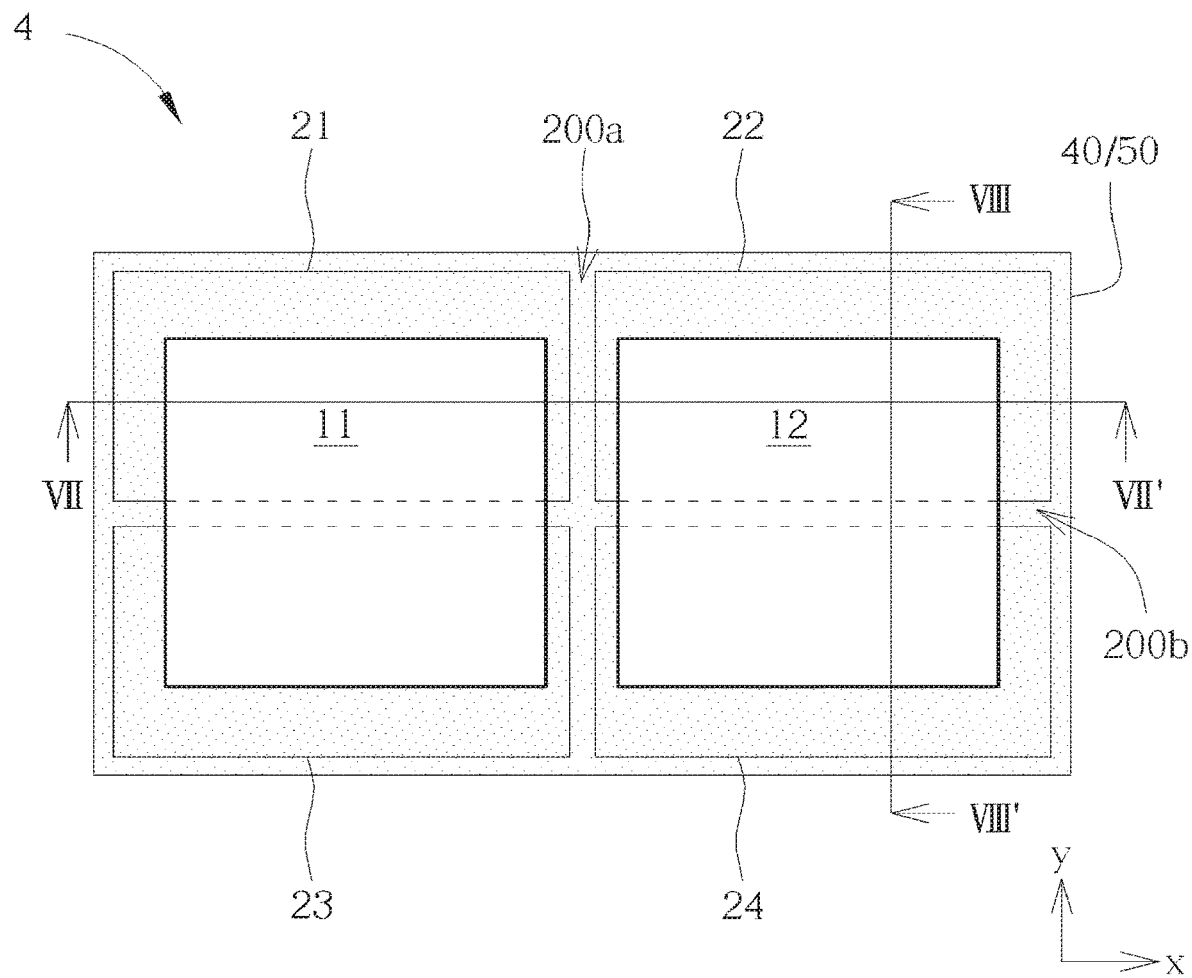
FIG. 17 is a block diagram illustrating a topographic view of a semiconductor package having four interposers in accordance with another embodiment of the invention.
Figure 18:
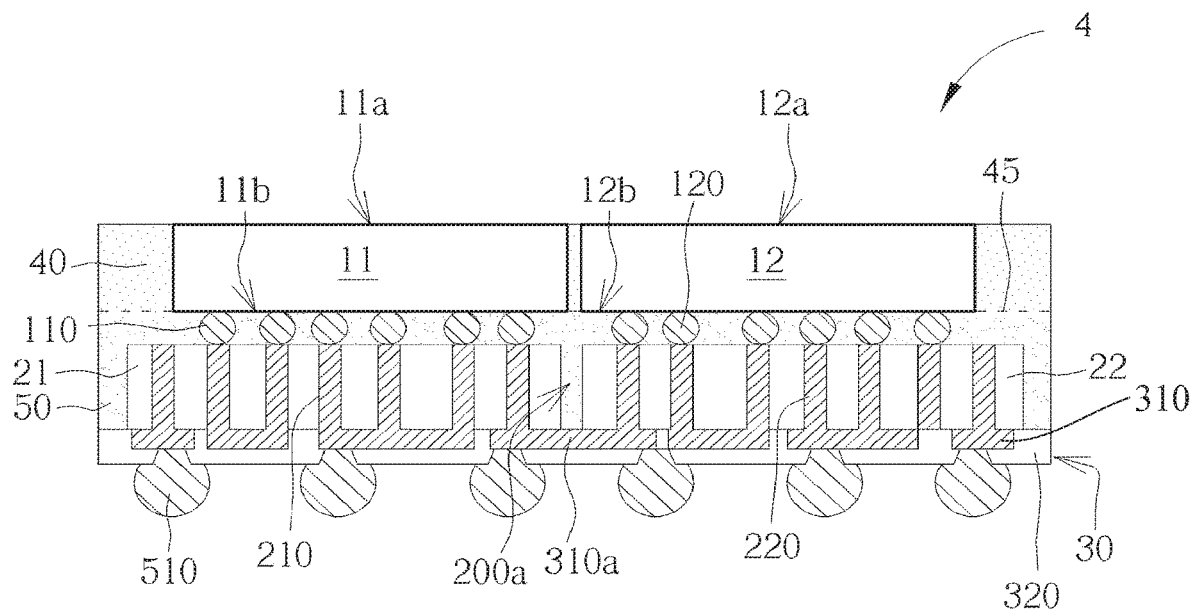
FIG. 18 is a schematic, cross-sectional diagram of the semiconductor package having four interposers taken along line VII-VII' of FIG. 17.
Figure 19:
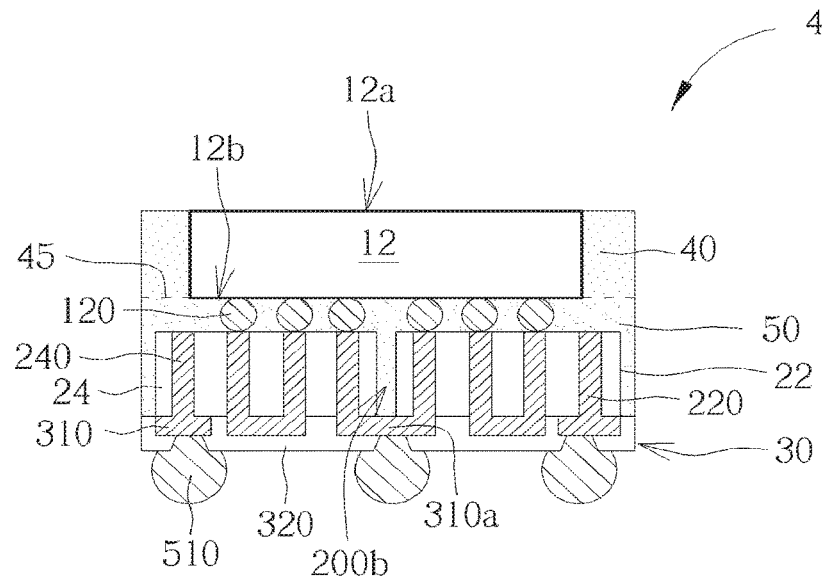
FIG. 19 is a schematic, cross-sectional diagram of the semiconductor package having four interposers taken along line VIII-VIII' of FIG. 17.

Please refer to FIG. 17 to FIG. 19. FIG. 17 is a block diagram illustrating a topographic view of a semiconductor package having four interposers in accordance with another embodiment of the invention. FIG. 18 is a schematic, cross-sectional diagram of the semiconductor package having four interposers taken along line VII-VII' of FIG. 17. FIG. 19 is a schematic, cross-sectional diagram of the semiconductor package having four interposers taken along line VIII-VIII' of FIG. 17.

As shown in FIG. 17 to FIG. 19, the semiconductor package 4 comprises four discrete interposers: a first interposer 21, a second interposer 22, a third interposer 23, and a fourth interposer 24. The four interposers may have the same size and may be arranged in a side-by-side manner. According to the embodiment, the four interposers may be respectively arranged in four quadrants of a reference coordinate. According to the embodiment, the four interposers may have a rectangular shape when viewed from the above.

A continuous, slender gap 200a extending along the reference y-axis is located between the first interposer 21 and the second interposer 22 and between the third interposer 23 and the fourth interposer 24. The gap 200a separates the first interposer 21 from the second interposer 22 and separates the third interposer 23 from the fourth interposer 24. A continuous, slender gap 200b extending along the reference x-axis is located between the first interposer 21 and the third interposer 23 and between the second interposer 22 and the fourth interposer 24. The gap 200a intersects the gap 200b.

According to various embodiments, the four interposers may be made of silicon, glass, or organic material. Other types of interposers can be used without departing from the scope of the disclosure. The four interposers 21, 22, 23 and 24 may be manufactured in wafer or array form and may contain integrated active or passive devices (not shown) and through silicon vias (TSVs).

A first die 11 is mounted onto the first interposer 21 and the third interposer 23 in a flip-chip manner. The first die 11 overlaps with the gap 200b. A second die 12 is mounted onto the second interposer 22 and the fourth interposer 24 in a flip-chip manner. The second die 12 overlaps with the gap 200b. According to the embodiment, the first die 11 and the second die 12 do not overlap with the gap 200a. According to the embodiment, the first die 11 and the second die 12 are coplanar. According to the embodiment, the first die 11 and the second die 12 are arranged in parallel along the reference x-axis. Although only two dies 11 and 12 are illustrated in the figures, it is understood that more dies, for example, three or four dies may be mounted on the two interposers in various embodiments.

As can be best seen in FIG. 18 and FIG. 19, the first die 11 is electrically connected to the first interposer 21 and the third interposer 23 (FIG. 17) through a plurality of connection elements 110 such as solder bumps or metal bumps. The second die 12 is electrically connected to the second interposer 22 and the fourth interposer 24 through a plurality of connection elements 120 such as solder bumps or metal bumps.

According to the embodiment, the first die 11 and the second die 12 are surrounded by a first molding compound 40. According to the embodiment, the connection elements 110, the connection elements 120, the four interposers 21, 22, 23 and 24 are encapsulated by a second molding compound 50. The gap 200a and the gap 200b are filled up with the second molding compound 50. According to the embodiment, the first molding compound 40 and the second molding compound 50 may comprise different compositions and may be cured at different temperatures, but is not limited thereto.

The semiconductor package 4 further comprises a redistribution layer (RDL) structure 30. The RDL structure 30 may comprise at least one metal layer 310 and at least one dielectric layer 320. The dielectric layer 320 may comprise organic materials such as polyimide (PI) or inorganic materials such as silicon nitride, silicon oxide or the like, but not limited thereto. The metal layer 310 may comprise aluminum, copper, tungsten, titanium, titanium nitride, or the like. It is understood that in some embodiments the RDL structure 30 may comprise multiple metal layers or traces.

According to the embodiment, the circuits including TSVs 210 in the first interposer 21 and the circuits including TSVs 220 in the second interposer 22 may be interconnected through at least one metal trace (or bridge trace) 310a, which traverses the gap 200a. The metal trace 310a and the metal layer 310 of the RDL structure 30 may propagate signals among the first die 11 and the second die 12. Connectors 510 such as solder balls, ball grid array (BGA) balls, C4 bumps, metal bumps, or metal pillars may be formed on the lower surface of the RDL structure 30 to electrically connect to the metal layer 310 and the metal trace 310a.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
    a first interposer and a second interposer laterally spaced apart from, parallel to and coplanar with the first interposer, the first interposer and the second interposer each comprising through silicon vias (TSVs);
    a first die extending transversely between and over the first interposer and the second interposer and having a first portion mounted on an upper surface of the first interposer and a second portion mounted on an upper surface of the second interposer;
    first connection elements connecting the first die to at least one of the first interposer and the second interposer;
    a redistribution layer (RDL) structure extending between and under the first interposer and the second interposer and disposed on bottom surfaces of the first interposer and the second interposer, the RDL structure comprising at least one dielectric layer and at least one continuous metal layer including at least one bridge trace extending between and electrically connecting the first interposer with the second interposer; and
    a molding compound in a gap between the spaced apart first interposer and the second interposer, separating the first interposer from the second interposer.

2. The semiconductor package of claim 1, further comprising connectors on a lower surface of the RDL structure electrically connected to the at least one metal layer.

3. The semiconductor package of claim 2, wherein the connectors comprise a ball grid array, C4 bumps, metal bumps, or metal pillars.

4. The semiconductor package of claim 1, further comprising another molding compound surrounding the first die.

5. The semiconductor package of claim 4, wherein the another molding compound laterally encapsulates the first connection elements, the first interposer, and the second interposer.

6. The semiconductor package of claim 5, wherein the molding compound and the another molding compound have different compositions.

7. The semiconductor package of claim 5, wherein an interface between the molding compound and the another molding compound is flush with an active surface of the first die.

8. The semiconductor package of claim 1, wherein the first connection elements comprise solder bumps or metal bumps.

9. The semiconductor package of claim 1, wherein the first interposer and the second interposer are of a common size.

10. The semiconductor package of claim 1, wherein the first interposer and the second interposer comprise silicon, glass or organic material.

11. The semiconductor die package of claim 1, wherein at least one of the first interposer and the second interposer contains at least one of integrated active devices or passive devices.

* * * * *

UNITED STATES PATENT AND TRADEMARK OFFICE
CERTIFICATE OF CORRECTION

| | |
|---|---|
| PATENT NO. | : 11,469,210 B2 |
| APPLICATION NO. | : 16/551072 |
| DATED | : October 11, 2022 |
| INVENTOR(S) | : Shing-Yih Shih |

It is certified that error appears in the above-identified patent and that said Letters Patent is hereby corrected as shown below:

In the Specification

| | | |
|---|---|---|
| Column 1, | Line 13, | change "reference reference." to --reference.-- |
| Column 7, | Line 29, | change "along line of" to --along line III-III' of-- |

Signed and Sealed this
Twenty-eighth Day of February, 2023

*Katherine Kelly Vidal*

Katherine Kelly Vidal
*Director of the United States Patent and Trademark Office*